(12) United States Patent
Cao (10) Patent No.: US 11,217,749 B2
(45) Date of Patent: Jan. 4, 2022

(54) FINE SHADOW MASK ASSEMBLY FOR AN ACTIVE MATRIX ORGANIC LIGHT EMITTING DIODE (AMOLED) AND FINE SHADOW MASK ASSEMBLY MANUFACTURING METHOD

(71) Applicant: WUHAN CHINA STAR OPTOELECTRONICS SEMICONDUCTOR DISPLAY TECHNOLOGY CO., LTD., Wuhan (CN)

(72) Inventor: Xuwen Cao, Wuhan (CN)

( * ) Notice: Subject to any disclaimer, the term of this patent is extended or adjusted under 35 U.S.C. 154(b) by 382 days.

(21) Appl. No.: 16/339,361

(22) PCT Filed: Oct. 12, 2018

(86) PCT No.: PCT/CN2018/110126
§ 371 (c)(1),
(2) Date: Apr. 4, 2019

(87) PCT Pub. No.: WO2019/242171
PCT Pub. Date: Dec. 26, 2019

(65) Prior Publication Data
US 2021/0226128 A1    Jul. 22, 2021

(30) Foreign Application Priority Data
Jun. 20, 2018   (CN) .......................... 201810637584.1

(51) Int. Cl.
*H01L 51/00* (2006.01)
*C23C 16/04* (2006.01)
(Continued)

(52) U.S. Cl.
CPC ........ *H01L 51/0011* (2013.01); *C23C 16/042* (2013.01); *H01J 9/142* (2013.01);
(Continued)

(58) Field of Classification Search
CPC .. H01L 51/0011; H01L 27/1288; H01J 9/144; H01J 9/142; H01J 29/076; H01J 29/073; H01J 29/07; C23C 16/042
See application file for complete search history.

(56) References Cited

U.S. PATENT DOCUMENTS 6,407,489 B1 * 6/2002 Lee .......................... H01J 29/07
313/402
6,407,490 B1 * 6/2002 Shin ........................ H01J 29/07
313/402
(Continued)

FOREIGN PATENT DOCUMENTS

CN           105839051 A  * 10/2016  ........... C23C 14/042

*Primary Examiner* — S M Sohel Imtiaz (57) ABSTRACT

An active matrix organic light emitting diode shadow mask assembly includes a shadow mask frame, longitudinal supporting bars, transverse spacer plates, shadow mask plates. The longitudinal supporting bars are disposed on the shadow mask frame at intervals. The transverse spacer plates are disposed on circular rod portions of the longitudinal supporting bars, are supported by the longitudinal supporting bars, are arranged at intervals. The shadow mask plates are disposed on the transverse spacer plates, are supported by the longitudinal supporting bars, parallel the transverse spacer plates. Each transverse spacer plate is located under a gap between adjacent shadow mask plates, contacts the shadow mask plates, covers the gap. The transverse spacer plates directly contacting the shadow mask plates effectively cover the gaps between the shadow mask plates, effectively prevent organic material in a later process from leaking through the shadow mask plates, dropping on to a lower glass substrate.

6 Claims, 9 Drawing Sheets

(51) Int. Cl.
*H01J 9/14* (2006.01)
*H01J 29/07* (2006.01)
*H01L 27/12* (2006.01)

(52) U.S. Cl.
CPC .............. *H01J 9/144* (2013.01); *H01J 29/07* (2013.01); *H01J 29/073* (2013.01); *H01J 29/076* (2013.01); *H01L 27/1288* (2013.01)

(56) References Cited

U.S. PATENT DOCUMENTS

| | | | | |
|---|---|---|---|---|
| 2001/0018309 | A1* | 8/2001 | Nishiki | H01J 9/142 |
| | | | | 445/30 |
| 2001/0033130 | A1* | 10/2001 | Ha | H01J 9/142 |
| | | | | 313/407 |
| 2002/0135286 | A1* | 9/2002 | Ha | H01J 29/073 |
| | | | | 313/402 |
| 2003/0117058 | A1* | 6/2003 | Reed | H01J 29/07 |
| | | | | 313/407 |
| 2004/0028875 | A1* | 2/2004 | Van Rijn | B01D 67/002 |
| | | | | 428/98 |
| 2010/0192856 | A1* | 8/2010 | Sung | H01L 51/0011 |
| | | | | 118/721 |
| 2011/0139069 | A1* | 6/2011 | Ahn | C23C 14/042 |
| | | | | 118/504 |
| 2013/0286151 | A1* | 10/2013 | Wakabayashi | B41J 2/44 |
| | | | | 347/247 |

* cited by examiner

FINE SHADOW MASK ASSEMBLY FOR AN ACTIVE MATRIX ORGANIC LIGHT EMITTING DIODE (AMOLED) AND FINE SHADOW MASK ASSEMBLY MANUFACTURING METHOD

FIELD OF INVENTION

The present invention relates to a shadow mask frame, especially to a fine shadow mask assembly for an active matrix organic light emitting diode (AMOLED) and a fine shadow mask assembly manufacturing method for an AMOLED. The fine shadow mask assembly for the AMOLED has excellent structure strength and can prevent deformation. Furthermore, when the fine shadow mask assembly for the AMOLED is employed in a vapor deposition process for manufacturing an AMOLED display panel, the structure of the fine shadow mask assembly itself is compact without any gaps and can prevent organic material for vapor deposition from inadvertently passing through the fine shadow mask assembly for the AMOLED and falling onto a glass substrate of the AMOLED display panel.

BACKGROUND OF INVENTION

Figure 1:
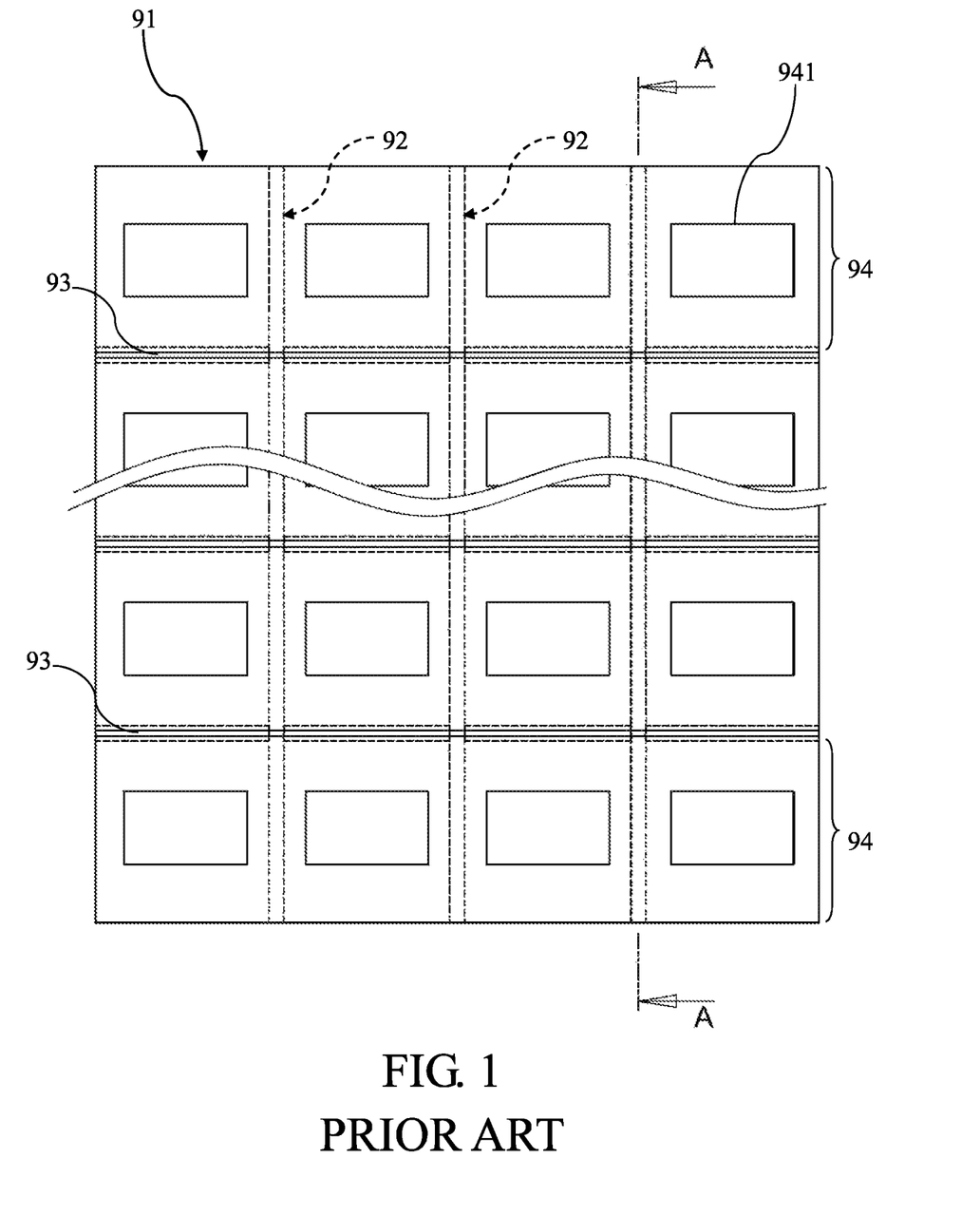
FIG. 1 is a top view of a conventional fine shadow mask assembly for an active matrix organic light emitting diode (AMOLED)
Figure 2:
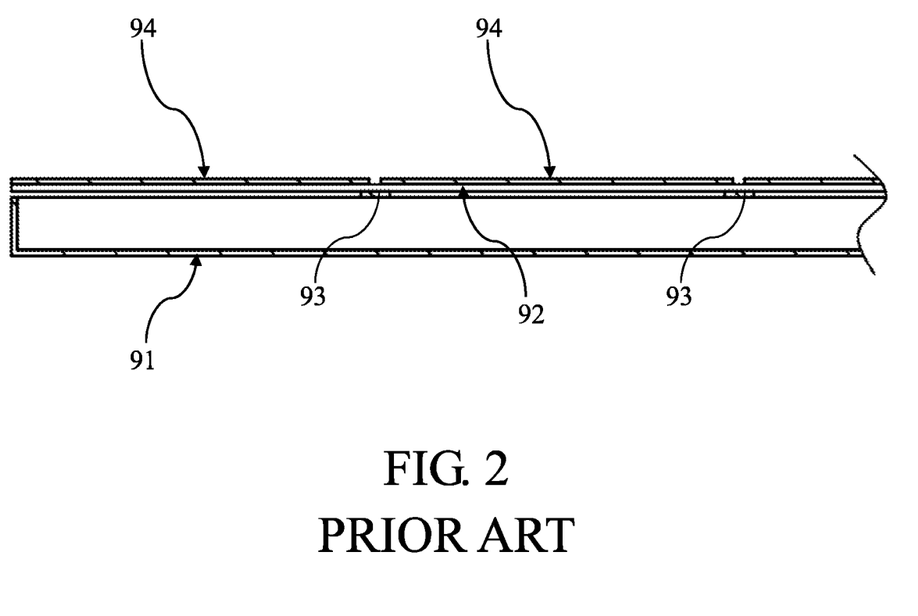
FIG. 2 is a partially enlarged cross sectional side view of the conventional fine shadow mask assembly for the AMOLED according to line A-A in FIG. 1.

With reference to FIGS. 1 and 2, a conventional fine shadow mask assembly for an active matrix organic light emitting diode (AMOLED) includes a shadow mask frame 91, a plurality of transverse spacer plates 93, a plurality of longitudinal supporting plates 92 and a plurality of shadow mask plates 94.

The shadow mask frame 91 is rectangular. The transverse spacer plates 93 are sheet plates, are tensioned and disposed on the shadow mask frame 91 at intervals. The longitudinal supporting plates 92 are sheet plates, are tensioned and disposed on the transverse spacer plates 93 at intervals, each longitudinal supporting plate 92 intersects the transverse spacer plates 93.

The shadow mask plates 94 are disposed on the longitudinal supporting plates 92 and is perpendicular to the transverse spacer plates 93 such that each of the transverse spacer plates 93 is located under a gap between adjacent two of the shadow mask plates 94. Each of the transverse spacer plates 93 mainly serves to cover and block the gap between the adjacent two shadow mask plates 94. When the fine shadow mask assembly for the AMOLED is used in a later vapor deposition process for manufacturing an AMOLED display panel, the transverse spacer plates 93 prevents organic material from falling downward through the gap onto a glass substrate (not shown in the figures) of the AMOLED display panel under the shadow mask plates 94 下. Furthermore, a plurality of pattern regions 941 are formed on each the shadow mask plate 94 to form pixel units of the AMOLED display panel in later processes of the AMOLED display panel.

However, the above-mentioned fine shadow mask assembly for the AMOLED has the following disadvantages.

1. To ensure that the shadow mask plates 94 are disposed flatly on the shadow mask frame 91 and would not has partial ridges or depressions relative to the shadow mask frame 91, the longitudinal supporting plates 92 need to be sheet plates and cannot include too much thickness. However, the sheet-like longitudinal supporting plates 92 has insufficient supporting strength and is easily deformed, which also makes the shadow mask plates 94 deform easily.

2. The transverse spacer plates 93 is disposed under the longitudinal supporting plates 92 and does not directly contact the shadow mask plates 94. Therefore, a gap exists between each of the transverse spacer plates 93 and a corresponding one of the shadow mask plates 94. The organic material in the vapor deposition can still fall on the lower glass substrate through such gaps.

3. The transverse spacer plates 93 is disposed under the longitudinal supporting plates 92 instead of being supported by the longitudinal supporting plate 92, and therefore deforms easily.

4. The sheet-like longitudinal supporting plates 92 contact the shadow mask plates 94 by surfaces so friction therebetween is large, which disadvantages fine adjustment of tension force when the longitudinal supporting plates 92 are tensioned.

Therefore, it is necessary to provide a fine shadow mask assembly for an AMOLED and a fine shadow mask assembly manufacturing method for the AMOLED to solve the issues of the prior art.

SUMMARY OF INVENTION

Technical Issue

A primary objective of the present invention is to provide an active matrix organic light emitting diode (AMOLED) fine shadow mask assembly, the fine shadow mask assembly for the AMOLED has excellent structure strength and can prevent deformation. Furthermore, when the fine shadow mask assembly for the AMOLED is employed in a vapor deposition process for manufacturing an AMOLED display panel, the structure of the fine shadow mask assembly itself is compact without any gaps and can prevent organic material for vapor deposition from inadvertently passing through the fine shadow mask assembly for the AMOLED and falling onto a glass substrate of the AMOLED display panel.

Technical Solution

To achieve the above-mentioned objective, the fine shadow mask assembly for the AMOLED of the present invention comprises:

a shadow mask frame;

a plurality of longitudinal supporting bars disposed on the shadow mask frame and arrange at intervals, each of the longitudinal supporting bars comprising a circular rod portion and two flat portions, and the two flat portions formed on two ends of the circular rod portion respectively, disposed on a top edge of the shadow mask frame, and located at two opposite sides of the shadow mask frame respectively;

a plurality of transverse spacer plates disposed on the circular rod portions of the longitudinal supporting bars, supported by the longitudinal supporting bars, intersecting the longitudinal supporting bars, and arranged at intervals; and a plurality of shadow mask plates disposed on the transverse spacer plates, supported by the longitudinal supporting bars, and paralleling the transverse spacer plates, wherein each of the transverse spacer plates is located under a gap between adjacent two of the shadow mask plates, contacts the adjacent two of the shadow mask plates, and covers the gap.

In the present invention, pairs of fixing notches are defined in the shadow mask frame, the pairs of the fixing notches correspond to the longitudinal supporting bars, the two fixing notches of each pair are defined in the top edge of the shadow mask frame, are located on the two opposite sides of the shadow mask frame respectively, and fix and receive the two flat portions of a corresponding one of the longitudinal supporting bars.

In the present invention, a top edge of the circular rod portion of each of the longitudinal supporting bars is flush with the top edge of the shadow mask frame.

In the present invention, a diameter of the circular rod portion of each of the longitudinal supporting bars is greater than a thickness of the flat portion.

In the present invention, a diameter of the circular rod portion of each of the longitudinal supporting bars is less than a width of the flat portion.

In the present invention, each of the flat portions of each of the longitudinal supporting bars comprises two soldering sides.

In the present invention, each of the flat portions of each of the longitudinal supporting bars comprises a truncated distal end.

In the present invention, a diameter of the circular rod portion of each of the longitudinal supporting bars is 0.6 mm, a thickness of the flat portions is 0.3 mm, and a depth of each of the fixing notches is 0.45 mm.

Another objective of the present invention is to provide an active matrix organic light emitting diode (AMOLED) fine shadow mask assembly manufacturing method comprising:

a shadow mask frame providing step, providing a shadow mask frame;

a longitudinal supporting bar disposing step, disposing a plurality of longitudinal supporting bars on the shadow mask frame, wherein each of the longitudinal supporting bars comprises a circular rod portion and two flat portions, the two flat portions are formed on two ends of the circular rod portion and are disposed on a top edge of the shadow mask frame;

a transverse spacer plates disposing step, disposing a plurality of transverse spacer plates on the circular rod portions of the longitudinal supporting bars, wherein the transverse spacer plates intersect the longitudinal supporting bars; and a shadow mask plate disposing step, disposing a plurality of shadow mask plates on the transverse spacer plates, wherein each of the transverse spacer plates is located under a gap between adjacent two of the shadow mask plates, contacts the adjacent two of the shadow mask plates, and covers the gap.

In the present invention, the fine shadow mask assembly for the AMOLED manufacturing method further comprises a longitudinal supporting bar tensioning step, the longitudinal supporting bar tensioning step is implemented before the transverse spacer plates disposing step, and comprises tensioning the longitudinal supporting bars.

In the present invention, the fine shadow mask assembly for the AMOLED manufacturing method further comprises a transverse spacer plate tensioning step, the transverse spacer plate tensioning step is implemented before the shadow mask plate disposing step, and comprises tensioning the transverse spacer plates.

In the present invention, the fine shadow mask assembly for the AMOLED manufacturing method further comprises a shadow mask plate tensioning step comprising tensioning the shadow mask plates.

Still another objective of the present invention is to provide an active matrix organic light emitting diode (AMOLED) fine shadow mask assembly comprising:

a shadow mask frame;

a plurality of longitudinal supporting bars disposed on the shadow mask frame and arrange at intervals, each of the longitudinal supporting bars comprising a circular rod portion and two flat portions, and the two flat portions formed on two ends of the circular rod portion respectively, disposed on a top edge of the shadow mask frame, and located at two opposite sides of the shadow mask frame respectively;

a plurality of transverse spacer plates disposed on the circular rod portions of the longitudinal supporting bars, supported by the longitudinal supporting bars, intersecting the longitudinal supporting bars, and arranged at intervals; and a plurality of shadow mask plates disposed on the transverse spacer plates, supported by the longitudinal supporting bars, and paralleling the transverse spacer plates, wherein each of the transverse spacer plates is located under a gap between adjacent two of the shadow mask plates, contacts the adjacent two of the shadow mask plates, and covers the gap;

wherein pairs of fixing notches are defined in the shadow mask frame, the pairs of the fixing notches correspond to the longitudinal supporting bars, the two fixing notches of each pair are defined in the top edge of the shadow mask frame, are located on the two opposite sides of the shadow mask frame respectively, and fix and receive the two flat portions of a corresponding one of the longitudinal supporting bars;

wherein a top edge of the circular rod portion of each of the longitudinal supporting bars is flush with the top edge of the shadow mask frame;

wherein a diameter of the circular rod portion of each of the longitudinal supporting bars is greater than a thickness of the flat portion;

wherein the diameter of the circular rod portion of each of the longitudinal supporting bars is less than a width of the flat portion;

wherein each of the flat portions of each of the longitudinal supporting bars comprises a truncated distal end.

Advantages

Compared to the prior art, the fine shadow mask assembly for the AMOLED of the present invention has the following advantages.

1. Each of the longitudinal supporting bars provides excellent supporting capability through the circular rod portion with the greater diameter such that the longitudinal supporting bars can stably support the shadow mask plates without deformation. Therefore, flatness of the shadow mask plates on the shadow mask frame is maintained.

2. Each of the transverse spacer plates directly contacts corresponding adjacent two of the shadow mask plates, closes the gap between the adjacent two shadow mask plates, and effectively prevents organic material in a later vapor deposition process from inadvertently passing through the gap between the adjacent shadow mask plates and falling onto a glass substrate of the AMOLED display panel, which improves yield of the later process.

3. The transverse spacer plates are disposed on the longitudinal supporting bars and are supported by the longitudinal supporting bars without deformation.

4. Each of the shadow mask plates contacts the circular rod portions of the longitudinal supporting bars in lines instead of surface contact as in the prior art, and therefore effectively reduce friction between the shadow mask plates and the longitudinal supporting bars, which facilitates fine adjustment to tension of the longitudinal supporting bars, the transverse spacer plates and the shadow mask plates.

To make the above content of the present invention clearer and understandable, preferred embodiments accompanied with drawings are described in detail as follows.

DETAILED DESCRIPTION OF PREFERRED EMBODIMENTS

Figure 3:
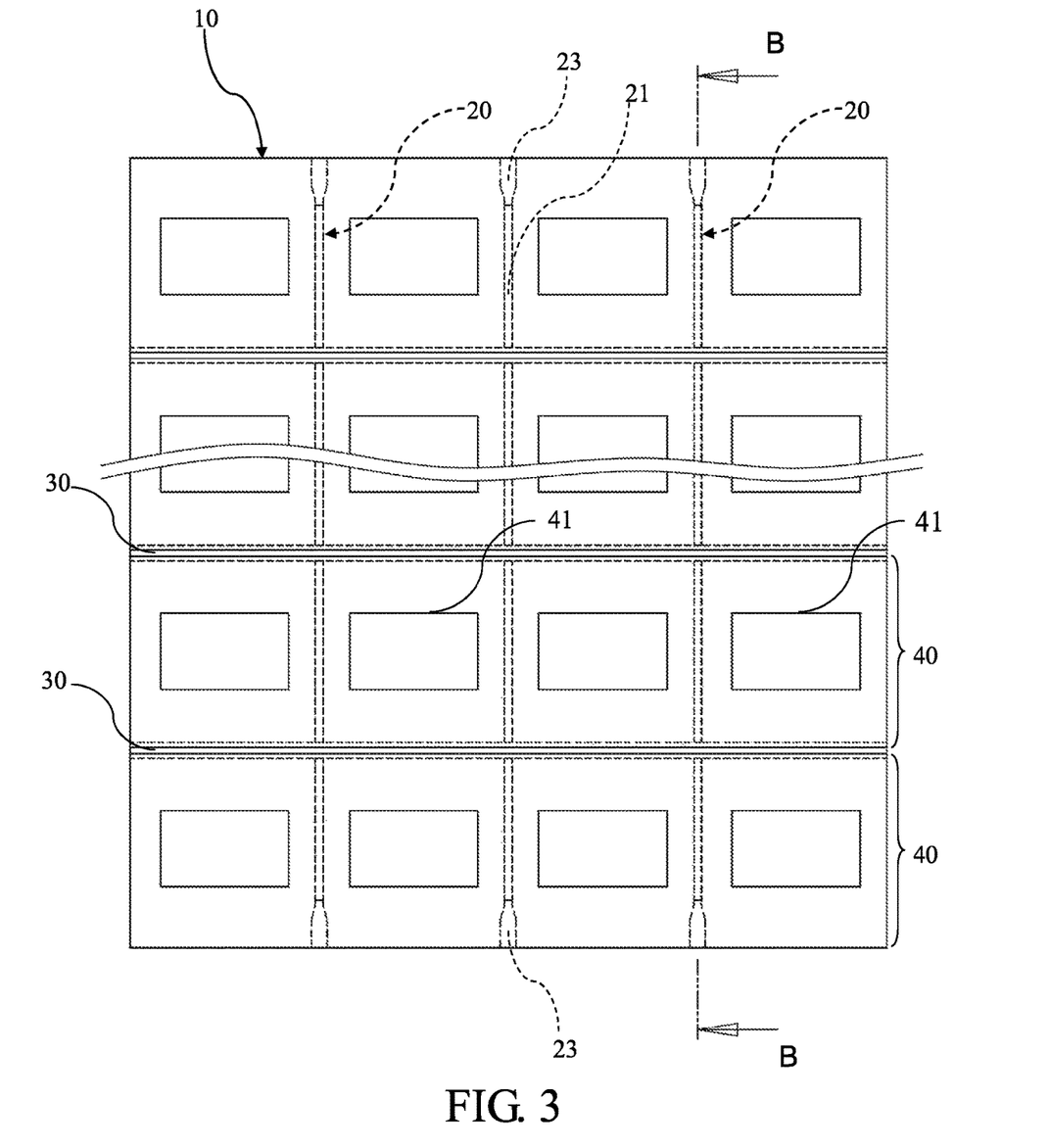
FIG. 3 is a top view of a fine shadow mask assembly for an AMOLED of the present invention.
Figure 4:
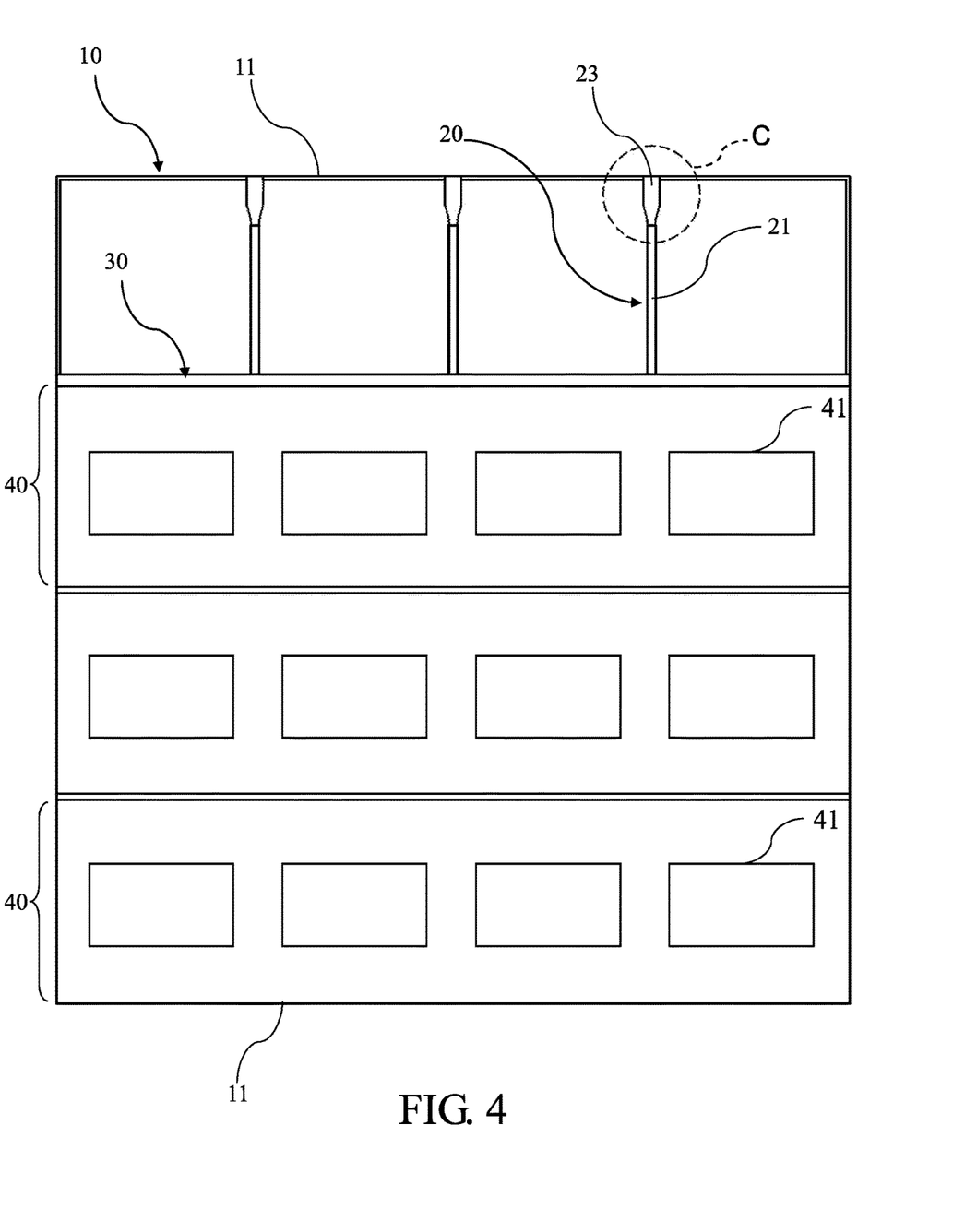
FIG. 4 is another top view of the fine shadow mask assembly for the AMOLED of the present invention, wherein one of the shadow mask plates is removed.
Figure 6:
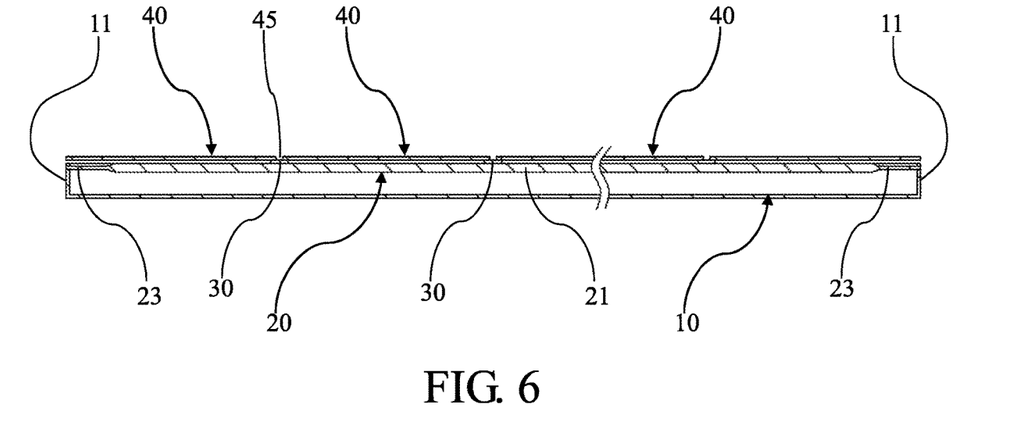
FIG. 6 is a cross sectional side view of the fine shadow mask assembly for the AMOLED of the present invention according to line B-B in FIG. 3.

With reference to FIGS. 3, 4 and 6, an active matrix organic light emitting diode (AMOLED) fine shadow mask assembly of the present invention comprises a shadow mask frame 10, a plurality of longitudinal supporting bars 20, a plurality of transverse spacer plates 30, and a plurality of shadow mask plates 40.

Figure 8:
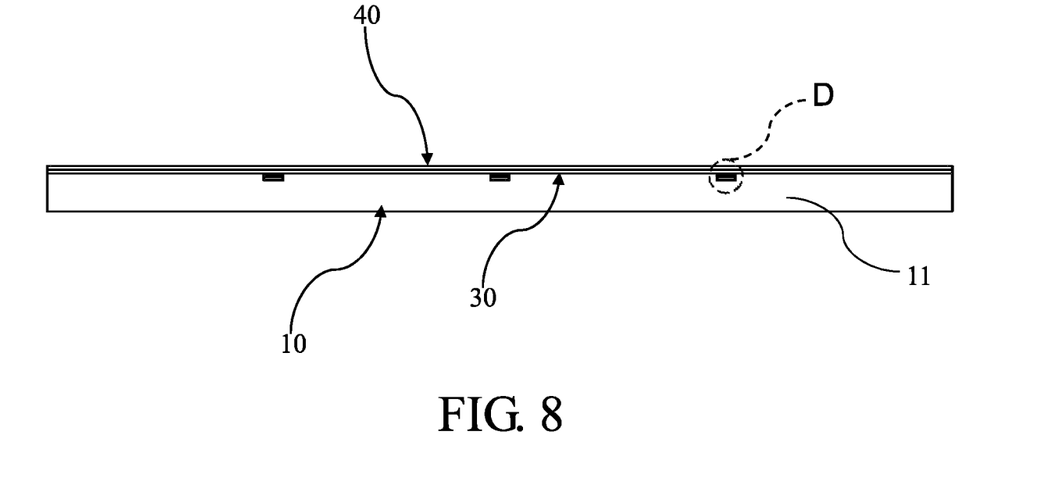
FIG. 8 is an end view of the fine shadow mask assembly for the AMOLED of the present invention.
Figure 9:
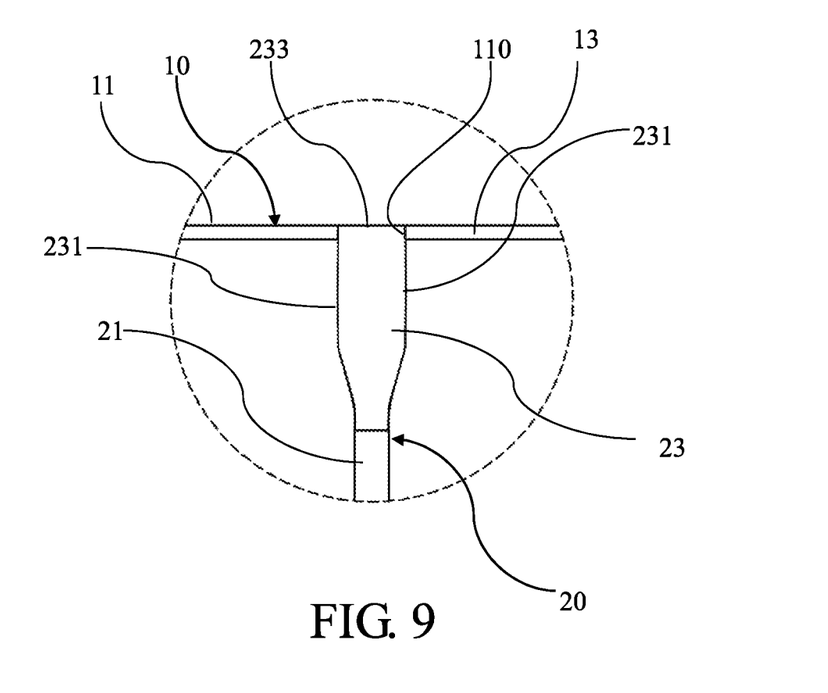
FIG. 9 is a partially enlarged top view of the fine shadow mask assembly for the AMOLED of the present invention according to a circle area C in FIG. 4.
Figure 10:
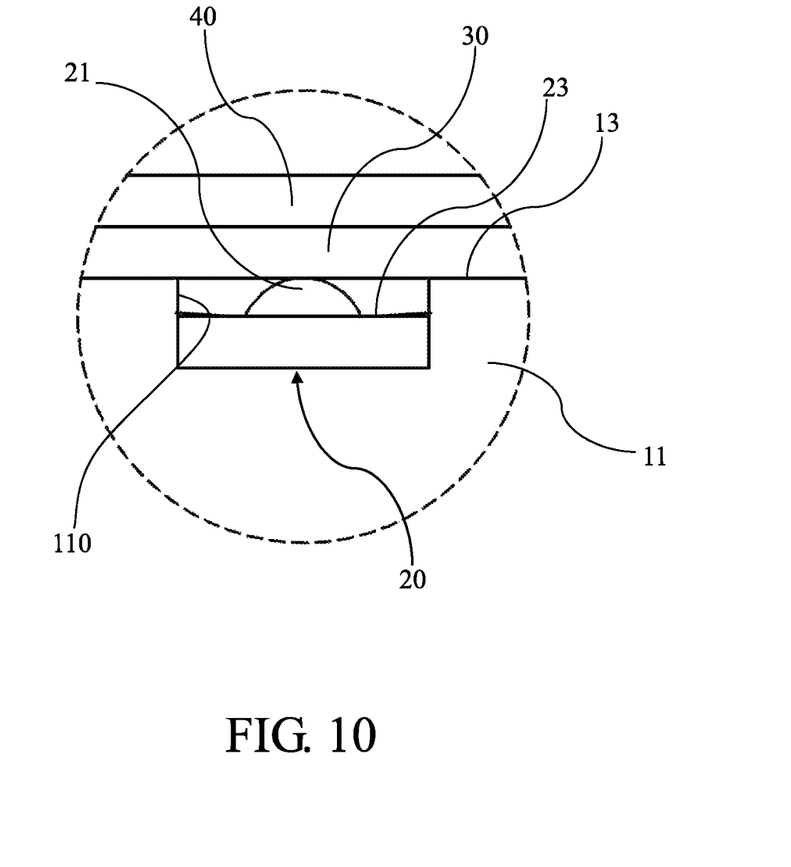
FIG. 10 is a partially enlarged end view of the fine shadow mask assembly for the AMOLED of the present invention according to a circle area D in FIG. 8.

With reference to FIGS. 8 to 10, the shadow mask frame 10 is substantially regular. Pairs of fixing notches 110 are defined in the shadow mask frame 10. The two fixing notches 110 of each pair are defined in a top edge 13 of the shadow mask frame 10, and are located two opposite sides 11 of the shadow mask frame 10.

Figure 5:
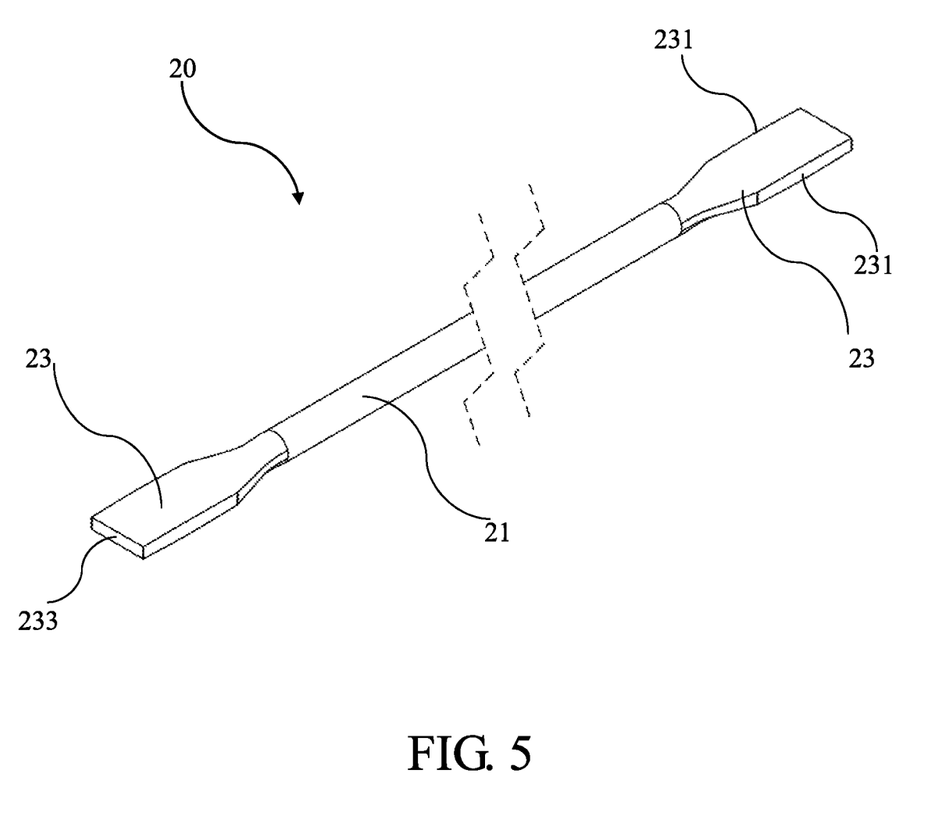
FIG. 5 is a perspective view of longitudinal supporting bars of the fine shadow mask assembly for the AMOLED of the present invention.

With reference to FIG. 5, the longitudinal supporting bars 20 are disposed on the shadow mask frame 10 and are arranged at intervals. Each of the longitudinal supporting bars 20 comprises a circular rod portion 21 and two flat portions 23.

Figure 7:
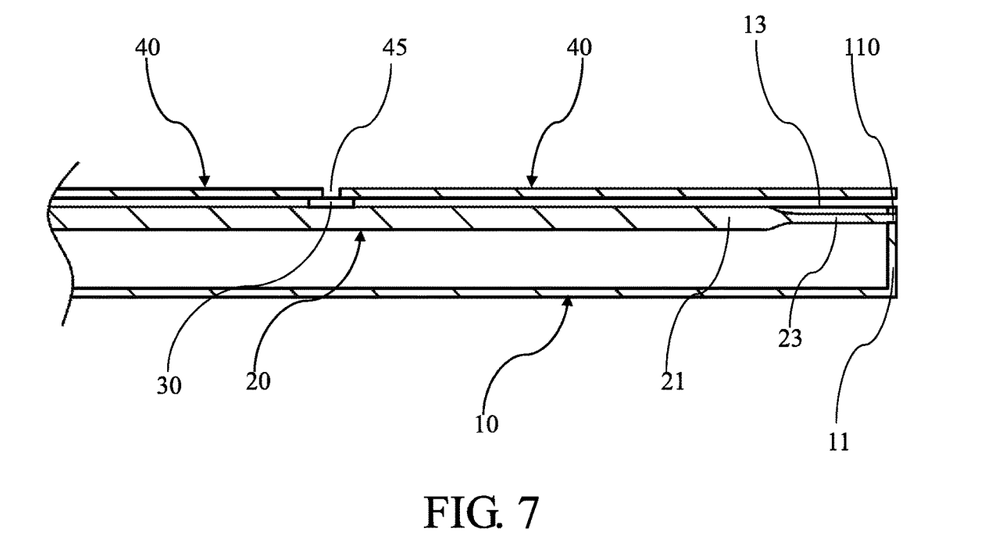
FIG. 7 is a partially enlarged cross sectional side view of the fine shadow mask assembly for the AMOLED of the present invention in FIG. 6.

With reference to FIGS. 7 and 9, the two flat portions 23 are formed on two ends of the circular rod portion 21 respectively, are disposed on the top edge 13 of the shadow mask frame 10, and are located on the two opposite sides 11 of the shadow mask frame 10. A diameter of the circular rod portion 21 of each of the longitudinal supporting bars 20 is greater than a thickness of the flat portion 23, as shown in FIG. 7. The diameter of the circular rod portion 21 of each of the longitudinal supporting bars 20 is less than a width of the flat portion 23, as shown in FIG. 9. The pairs of the fixing notches 110 correspond to the longitudinal supporting bars 20, and the fixing notches 110 of each pair fix and receive the two flat portions 23 of a corresponding one of the longitudinal supporting bars 20. Furthermore, a top edge of the circular rod portion 21 of each of the longitudinal supporting bars 20 is flush with the top edge 13 of the shadow mask frame 10 such that the shadow mask frame 10 and the longitudinal supporting bars 20 can cooperate with each other to form a flat supporting top surface to flatly support the transverse spacer plates 30 and the shadow mask plates 40.

In a preferred embodiment, each of the flat portions 23 of each of the longitudinal supporting bars 20 comprises two soldering sides 231 and a truncated distal end 233. The two soldering sides 231 can be attached with soldering material such as tin solder. The truncated distal end 233 can be flush with one side 11 of the shadow mask frame 10.

In a preferred embodiment, the diameter of the circular rod portion 21 of each of the longitudinal supporting bars 20 is 0.6 mm, the thickness of the flat portion 23 is 0.3 mm, and a depth of each of the fixing notches 110 is 0.45 mm.

The transverse spacer plates 30 are disposed on the circular rod portions 21 of the longitudinal supporting bars 20, are supported by the longitudinal supporting bars 20, intersect the longitudinal supporting bars 20, and are arranged at intervals\.

The shadow mask plates 40 are disposed on the transverse spacer plates 30, are indirectly supported by the longitudinal supporting bars 20, and parallel the transverse spacer plates 30. Each of the transverse spacer plates 30 is located under a gap 45 of adjacent two of the shadow mask plates 40, contact the adjacent two shadow mask plates 40, and covers the gap 45, as shown in FIG. 7.

Figure 11:
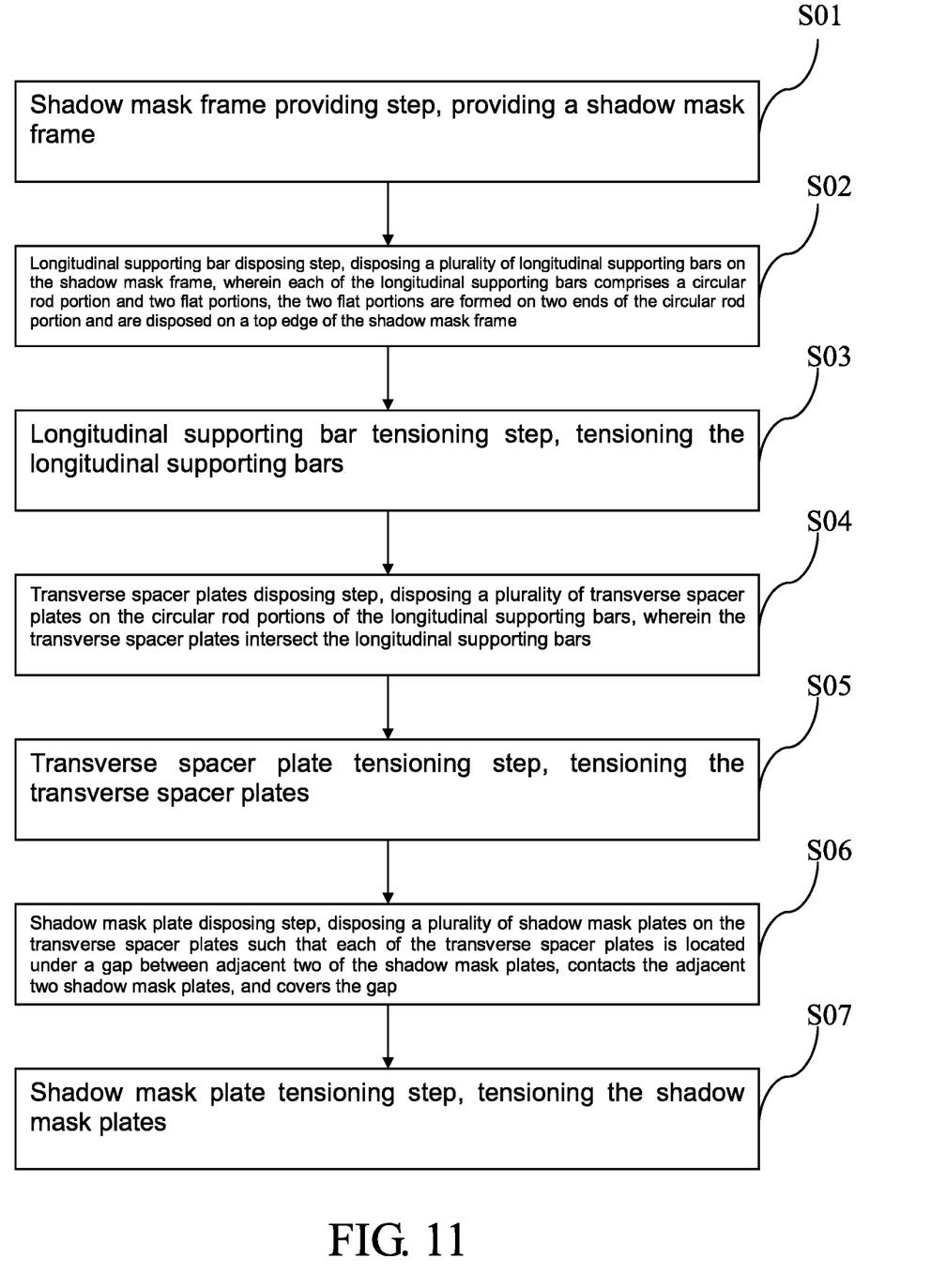
FIG. 11 is a flowchart of a fine shadow mask assembly manufacturing method for an AMOLED of the present invention.

With reference to FIG. 11, another objective of the present invention is to provide a fine shadow mask assembly manufacturing method for an AMOLED comprising: a shadow mask frame providing step S01, a longitudinal supporting bar disposing step S02, a longitudinal supporting bar tensioning step S03, a transverse spacer plates disposing step S04, a transverse spacer plate tensioning step S05, a shadow mask plate disposing step S06, and a shadow mask plate tensioning step S07.

The shadow mask frame providing step S01 comprises providing a shadow mask frame 10.

The longitudinal supporting bar disposing step S02 comprises disposing a plurality of longitudinal supporting bars 20 on the shadow mask frame 10. Each of the longitudinal supporting bars 20 comprises a circular rod portions 21 and two flat portions 23. The two flat portions 23 are formed on two ends of the circular rod portions 21 respectively and are disposed on a top edge of the shadow mask frame 10.

The longitudinal supporting bar tensioning step S03 comprises tensioning the longitudinal supporting bars 20.

The transverse spacer plates disposing step S04 comprises disposing a plurality of transverse spacer plates 30 on the circular rod portions 21 of the longitudinal supporting bars 20. The transverse spacer plates 30 intersect the longitudinal supporting bars 20.

The transverse spacer plate tensioning step S05 comprises tensioning the transverse spacer plates 30.

The shadow mask plate disposing step S06 comprises disposing a plurality of shadow mask plates 40 on the transverse spacer plates 30 such that each of the transverse spacer plates 30 is located under a gap 45 between adjacent two of the shadow mask plates 40, contacts the adjacent two shadow mask plates 40, and covers the gap 45.

The shadow mask plate tensioning step S07 comprises tensioning the shadow mask plates 40.

Compared to the prior art, the fine shadow mask assembly for the AMOLED of the present invention has the following advantages.

1. Each of the longitudinal supporting bars 20 provides excellent supporting capability through the circular rod portion 21 with the greater diameter such that the longitudinal supporting bars 20 can stably support the shadow mask plates 40 without deformation. Therefore, flatness of the shadow mask plates 40 on the shadow mask frame 10 is maintained.

2. Each of the transverse spacer plates 30 directly contacts corresponding adjacent two of the shadow mask plates 40, closes the gap 45 between the adjacent two shadow mask plates 40, and effectively prevents organic material in a later vapor deposition process from inadvertently passing through the gap 45 between the adjacent shadow mask plates 40 and falling onto a glass substrate of the AMOLED display panel, which improves yield of the later process.

3. The transverse spacer plates 30 are disposed on the longitudinal supporting bars 20, are supported by the longitudinal supporting bars 20 without deformation.

4. Each of the shadow mask plates 40 contacts circular rod portions 21 of the longitudinal supporting bars 20 in lines instead of surface contact as in the prior art, and therefore effectively reduce friction between the shadow mask plates 40 and the longitudinal supporting bars 20, which facilitates fine adjustment to tension of the longitudinal supporting bars 20, the transverse spacer plates 30 and the shadow mask plates 40.

5. In the above fine shadow mask assembly manufacturing method for the AMOLED, because the longitudinal supporting bars 20, the transverse spacer plates 30 and the shadow mask plates 40 are sequentially tensioned, it is ensured that the longitudinal supporting bars 20 can support the transverse spacer plates 30 and the shadow mask plates 40 to prevent the transverse spacer plates 30 and the shadow mask plates 40 from drooping and deforming.

What is claimed is:

1. A fine shadow mask assembly for an active matrix organic light emitting diode (AMOLED), comprising:
    a shadow mask frame;
    a plurality of longitudinal supporting bars disposed on the shadow mask frame and arrange at intervals, each of the longitudinal supporting bars comprising a circular rod portion and two flat portions, and the two flat portions formed on two ends of the circular rod portion respectively, disposed on a top edge of the shadow mask frame, and located at two opposite sides of the shadow mask frame respectively;
    a plurality of transverse spacer plates disposed on the circular rod portions of the longitudinal supporting bars, supported by the longitudinal supporting bars, intersecting the longitudinal supporting bars, and arranged at intervals; and
    a plurality of shadow mask plates disposed on the transverse spacer plates, supported by the longitudinal supporting bars, and paralleling the transverse spacer plates, wherein each of the transverse spacer plates is located under a gap between adjacent two of the shadow mask plates, contacts the adjacent two of the shadow mask plates, and covers the gap;
    wherein pairs of fixing notches are defined in the shadow mask frame, the pairs of the fixing notches correspond to the longitudinal supporting bars, the two fixing notches of each pair are defined in the top edge of the shadow mask frame, are located on the two opposite sides of the shadow mask frame respectively, and fix and receive the two flat portions of a corresponding one of the longitudinal supporting bars;
    wherein a diameter of the circular rod portion of each of the longitudinal supporting bars is 0.6 mm, a thickness of the flat portions is 0.3 mm, and a depth of each of the fixing notches is 0.45 mm.

2. The fine shadow mask assembly for the AMOLED as claimed in claim 1, wherein a top edge of the circular rod portion of each of the longitudinal supporting bars is flush with the top edge of the shadow mask frame.

3. The fine shadow mask assembly for the AMOLED as claimed in claim 1, wherein a diameter of the circular rod portion of each of the longitudinal supporting bars is greater than a thickness of the flat portion.

4. The fine shadow mask assembly for the AMOLED as claimed in claim 1, wherein a diameter of the circular rod portion of each of the longitudinal supporting bars is less than a width of the flat portion.

5. The fine shadow mask assembly for the AMOLED as claimed in claim 1, wherein each of the flat portions of each of the longitudinal supporting bars comprises two soldering sides.

6. The fine shadow mask assembly for the AMOLED as claimed in claim 1, wherein each of the flat portions of each of the longitudinal supporting bars comprises a truncated distal end.

\* \* \* \* \*